(12) United States Patent
Ueno et al.

(10) Patent No.: US 6,392,148 B1
(45) Date of Patent: May 21, 2002

(54) WIRE HARNESS JOINT

(75) Inventors: Seiichi Ueno; Takuro Wakabayashi; Keitaro Wada, all of Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/536,759

(22) Filed: Mar. 28, 2000

(51) Int. Cl.[7] ................................................ H02G 3/00
(52) U.S. Cl. ........................ 174/72 A; 174/117 F; 174/261
(58) Field of Search ..................... 174/72 A, 117 F, 174/117 FF, 250, 251, 261, 268

(56) References Cited

U.S. PATENT DOCUMENTS

| | | | |
|---|---|---|---|
| 3,546,663 A | * 12/1970 | Holmberg | 174/84 R |
| 3,715,457 A | * 2/1973 | Teagno et al. | 174/117 FF |
| 4,065,199 A | * 12/1977 | Andre et al. | 174/72 A |
| 4,831,278 A | * 5/1989 | Ueda et al. | 174/72 A |
| 4,862,011 A | * 8/1989 | Wright | 174/72 A |
| 4,963,699 A | * 10/1990 | Urushibata et al. | 174/72 A |
| 5,057,026 A | 10/1991 | Sawai et al. | |
| 5,137,468 A | 8/1992 | Murakami | |
| 5,255,155 A | * 10/1993 | Sugimoto et al. | 174/72 A |
| 5,460,530 A | * 10/1995 | Toba et al. | 174/72 A |
| 5,501,605 A | 3/1996 | Ozaki et al. | |
| 5,598,627 A | * 2/1997 | Saka et al. | 174/72 A |
| 5,663,870 A | * 9/1997 | Kerndlmaier | 174/261 |
| 6,043,435 A | * 3/2000 | Yamaguchi et al. | 174/117 F |
| 6,205,031 B1 | * 3/2001 | Herzog et al. | 174/117 F |

FOREIGN PATENT DOCUMENTS

| | | |
|---|---|---|
| EP | 0 540 319 A2 | 5/1993 |
| GB | 2 275 373 A | 8/1994 |

* cited by examiner

*Primary Examiner*—Dean A. Reichard
*Assistant Examiner*—Adolfo Nino
(74) *Attorney, Agent, or Firm*—Griffin & Szipl, PC

(57) ABSTRACT

The present invention provides a wire harness joint including a wiring circuit assembly and an insulation film or insulation films applied to the wiring circuit assembly, either on one or both sides. The wiring circuit assembly includes a number of flexible flat cables (FFC) disposed separately so that each one will not intersect another. The wiring circuit assembly further includes connections for connecting the tips of a wire harness that includes a plurality of parallel disposed FFCs to the FFCs of the wiring circuit assembly. Each of the insulation films is formed with windows at positions corresponding to the connections.

8 Claims, 22 Drawing Sheets

WIRE HARNESS JOINT

FIELD OF THE INVENTION

The present invention relates to a wire harness joint for connecting harness within a vehicle such as motorcar and, particularly, to such a wire harness joint which can be reduced in thickness, disposed within the vehicle at any position and yet assembled in an easy and simple manner.

BACKGROUND OF THE INVENTION

For example, as shown in FIG. 12, an electric circuit used in the vehicle such as motorcar comprises a battery 101, two trunk wires 111 connected to the battery 101 and branch wires 112 connected in parallel between the trunk wires 111. Each of the branch wires 112 may include a switch 103, an electric lamp 104, a motor 105 or the like. A joint 106 may be used to connect between the trunk and branch wires 111, 112. Such a joint may include a splice terminal, a joint connector, a welded joint and others.

As can be seen from FIG. 13, the splice terminal comprises a terminal 114 clamped over the bundled ends of the naked and exposed conductors 110a of the trunk and branch wires 111, 112 to be joined and a plastic tape or tube 113 covering the terminal 114 and naked conductors 110a to provide an insulation. Such a splice terminal has an advantage in that it can provide a compact and simple branch at any position.

However, this operation in which the trunk and branch wires 111, 112 are naked to expose the conductors 110a and then the terminal 114 is clamped over the bundle of the exposed conductors 110a is troublesome and difficult to be automated. Furthermore, the covering of the joint section with the plastic tape 113 or the like must manually be performed. This raises a problem in that the insulating property is not made stable.

In place of the splice terminal, therefore, the joint connector or welded joint has been broadly used in the art. As can be seen from FIG. 14, the joint connector comprises female terminals 120 attached to the conductors 110a of branch wires 112, a comb-like bus bar 121 fitted into the female terminals 120 and a connector housing 122 covering the female terminals 120 and bus bar 121. Such a joint connector raises another problem in that it has an increased number of parts and is increased in manufacturing cost.

On the other hand, as shown in FIG. 15, the welded joint is formed by welding the exposed conductors 110a of wires 110, turning the welded conductor portions, covering the turned conductor portions with an insulation cap 123 and winding a plastic tape 113 around the turned conductors. The welded portions of the conductors 110a must be turned in view of the structural and operational constraints. However, the turned conductor portions form a thicker bundle of wires which cannot optionally be mounted at any desired position.

All of the splice terminal, joint connector and welded joint structures raise a further problem in that they are constrained in number of joinable circuits, in addition to the aforementioned problems.

In order to deal with the increased number of circuits, the provision of a plurality of joint boxes for integrating a plurality of dispersed joints has been considered. FIG. 16 shows such a joint box which comprises an upper casing 131, a lower casing 132 mounted on the upper casing 131 to form a space therewith, a multi-layer bus bar 133 located within the space between the upper and lower casings 131, 132 and an insulation plastic plate 134 located between the layers of the multi-layer bus bar 133, the bent tips of the bus bar 133 forming male terminals 133a which outwardly protrude from between the upper and lower casings 131, 132. These male terminals 133a are connected to the respective female terminals on the ends of wires in a wire harness (not shown). The bus bar 133 is pressed and stamped from a flat conductive sheet which may be made of copper, copper alloy or the like. In FIG. 16, reference numeral 150 denotes a housing on the upper casing; and 151 through-holes formed in the insulation plate to receive the male terminals 133a.

Recently, in place of such a combination of the bus bar 133 with the insulation plate 134, a flexible printed board (FPC) may be utilized for the same purpose. FPC is connected to tangs on the tip of a wire harness, but not have the male terminals 133a.

A further wire harness joint constructed according to the prior art will now be described with reference to FIG. 17. The wire harness joint comprises wiring circuit assemblies 10 which are formed by wire harnesses and insulation films applied to a plurality of flexible linear and flat cables (FFC's) 11 on one or both sides in the middles or extremities of the wire harnesses 30. Three transverse wiring circuit assemblies 10 are superposed on the longitudinal wiring circuit assembly 10. Connection holes 23 are formed through the insulation films at the portions of the superposed FFC's 11 to be connected.

However, such a technique also raises the following problem:

Since the joint box is weight and bulk, a number of such joint boxes cannot be located within the motorcar at any desired positions. It is undesirably usual that the joint boxes are mainly located within the engine room and/or on the back of the firewalls. Such a constraint increases the length of wires in the wire harnesses placed within the engine room or the like.

Since the male terminals 133a on the tips of the wire harness must be formed by turning the tips of the bus bar 133, the operation required thereby is troublesome. Furthermore, the bus bar 133 has its increased thickness, for example, equal to 0.65 mm or 0.8 mm, for the standards of tab thickness in the male terminals 133a.

Consequently, the prior art bus bar 133 cannot be used to increase the compactness of circuit, resulting in increase of the joint box dimensions. Since an increased number of joint boxes cannot be placed within the engine room to increase the number of electric parts, the prior art cannot meet a need of improving the comfortability in the passenger motorcar.

In the wire harness connecting to the male terminals 133a of the joint box, the wires are colored while the tips are arranged in alignment with the pitch in the male terminals 133a of the bus bar 133 using the connector housing, the female terminals being then clamped against these tips. Such an operation is troublesome and raises a further problem in that the cost required to machine and work the parts including the female terminals and housing will increase.

Since FFC's 11 are parallel and linear in the wire harness joint structure of the prior art, it can inexpensively be produced in a continuous manner, but the superposing and assembling operations becomes troublesome. Thus, the prior art can only produce such a wire harness joint which the FFC's 11 of the wire harness 30 are parallel and linear with a reduced number of circuits.

SUMMARY OF THE INVENTION

It is therefore an object of the present invention to provide a wire harness joint which can be reduced in thickness, disposed within a motorcar at any position and yet inexpensively assembled in an easy and simple manner.

In one aspect of the present invention, it provides a wire harness joint comprising a wiring circuit assembly for connecting wire harnesses which a plurality of flexible flat cables are arranged in parallel, and insulation film applied to said wiring circuit assembly on one or both sides, said wiring circuit assembly having a plurality of flexible flat cables with connections for connecting said wire harnesses, said plurality of flexible being arranged separately from one another so that said flexible flat cables will not intersect one another, and said insulation film having windows formed therethrough at positions corresponding to said connections.

In the second aspect of the present invention, it provides a wire harness joint comprising a wiring circuit assembly for connecting wire harnesses which a plurality of flexible flat cables are arranged in parallel, and insulation film applied to said wiring circuit assembly on one or both sides, said wiring circuit assembly having a plurality of flexible flat cables with connections for connecting said wire harnesses, said plurality of flexible being superposed one over another into plural layers with said insulation film therebetween, and said insulation film including windows formed therethrough at positions corresponding to said connections In the third aspect of the present invention, it provides a wire harness joint comprising a wiring circuit assembly for connecting wire harnesses which a plurality of flexible flat cables are arranged in parallel, and insulation film applied to said wiring circuit assembly on one or both sides, said wiring circuit assembly including a plurality of openings formed therethrough and a connection formed near each of said openings for connecting one of said wire harnesses, and said insulation film including windows formed therethrough at positions corresponding to said connections.

The wire harness joint includes connection terminals each of which has a flat face and a plurality of upstanding legs formed on the opposite side edges of said flat face. The tips of said upstanding legs opposed to each other are turned toward each other so that they will penetrate the top face of said wiring circuit assembly from the bottom face of the same to provide an electrical connection between each of said connection terminals and said wiring circuit assembly.

The wiring circuit assembly, insulation film and connection portions of said wire harness connected are covered with an adhesive insulation film. The whole or part of the adhesive insulation film is fixedly mounted on any structural material in the vehicle or instrument.

The wiring circuit assembly, insulation film and connection portions of said wire harness connected are shaped for the configuration of the mount portion of the vehicle or instrument. The whole or part of the shaped portion is fixedly mounted on the structural material of the vehicle or instrument.

The wiring circuit assembly is folded to align the extremities of said connections. In such a case, the wiring circuit assembly may be partially cut or be formed with slits.

Therefore, the wire harness joint of the present invention can be reduced in thickness so that it can be mounted in any desired structure at any position and can easily and simply be assembled.

BRIEF DESCRIPTION OF THE DRAWINGS

FIG. 21(A) is a perspective view of a connection terminal while

DESCRIPTION OF THE PREFERRED EMBODIMENTS

Figure 1:
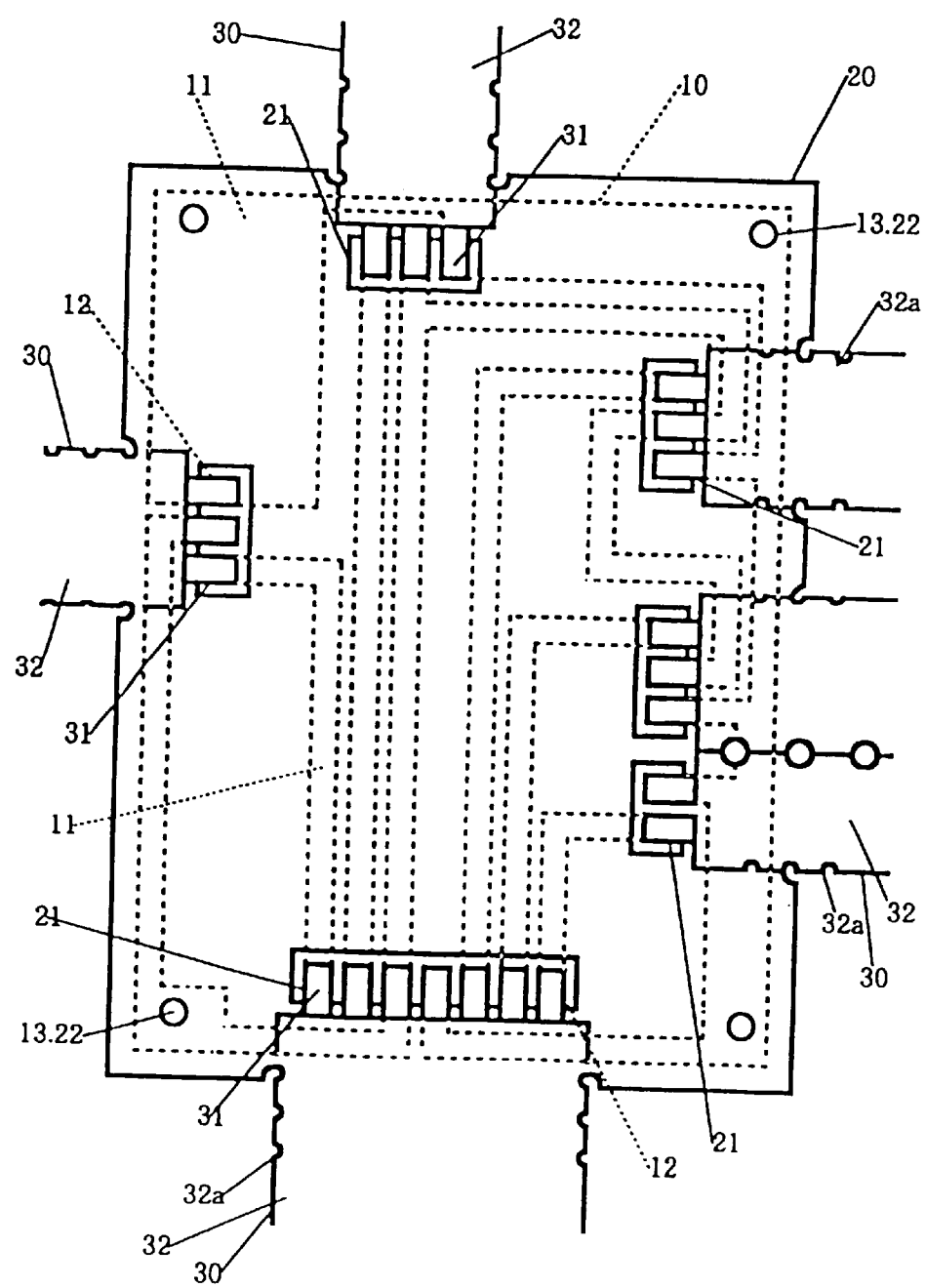
FIG. 1 is a plan view of a wire harness joint constructed according to the first embodiment of the present invention.
Figure 2:
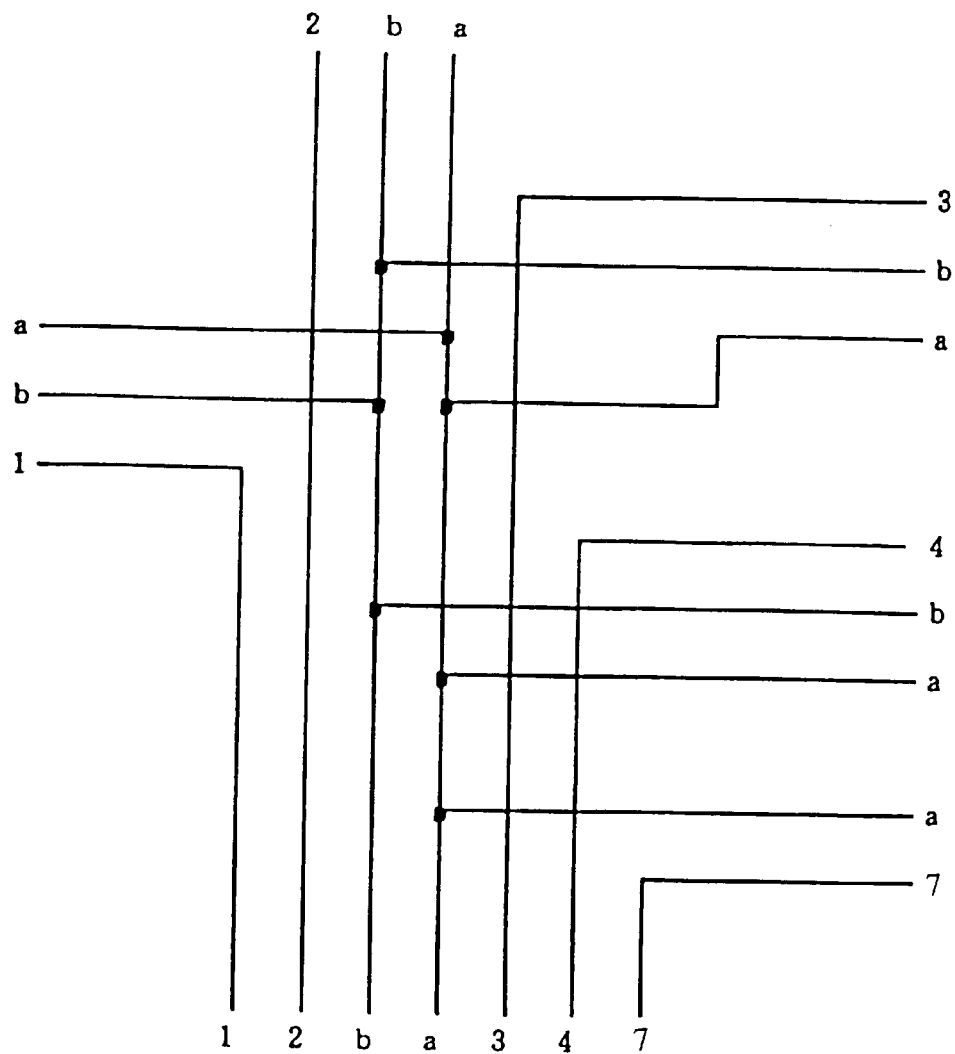
FIG. 2 is a circuit diagram of the wire harness joint according to the present invention.

First and second embodiments of the present invention will now be described with reference to FIGS. 1 to 11. First of all, there will be described a wiring circuit assembly 10 for such an electrical circuit as shown in FIG. 2. In FIGS. 3 and 6–11, reference numerals ア, a, b, 1, 2 . . . show connections 12 to be connected to the extremities of wires in wire harnesses.

Figure 3:
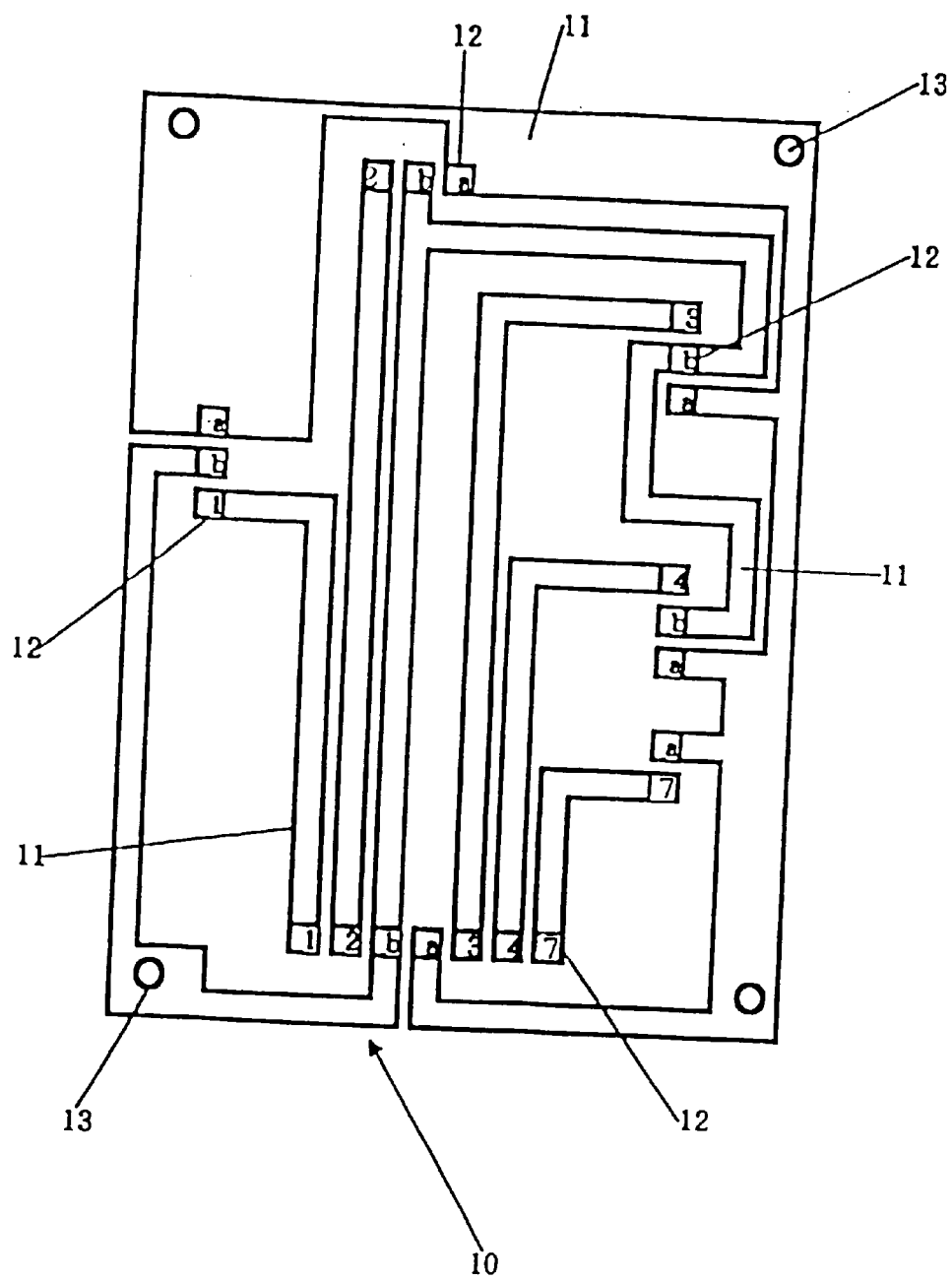
FIG. 3 is a plan view of a wiring circuit assembly in the wire harness joint constructed according to the first embodiment of the present invention.
Figure 4:
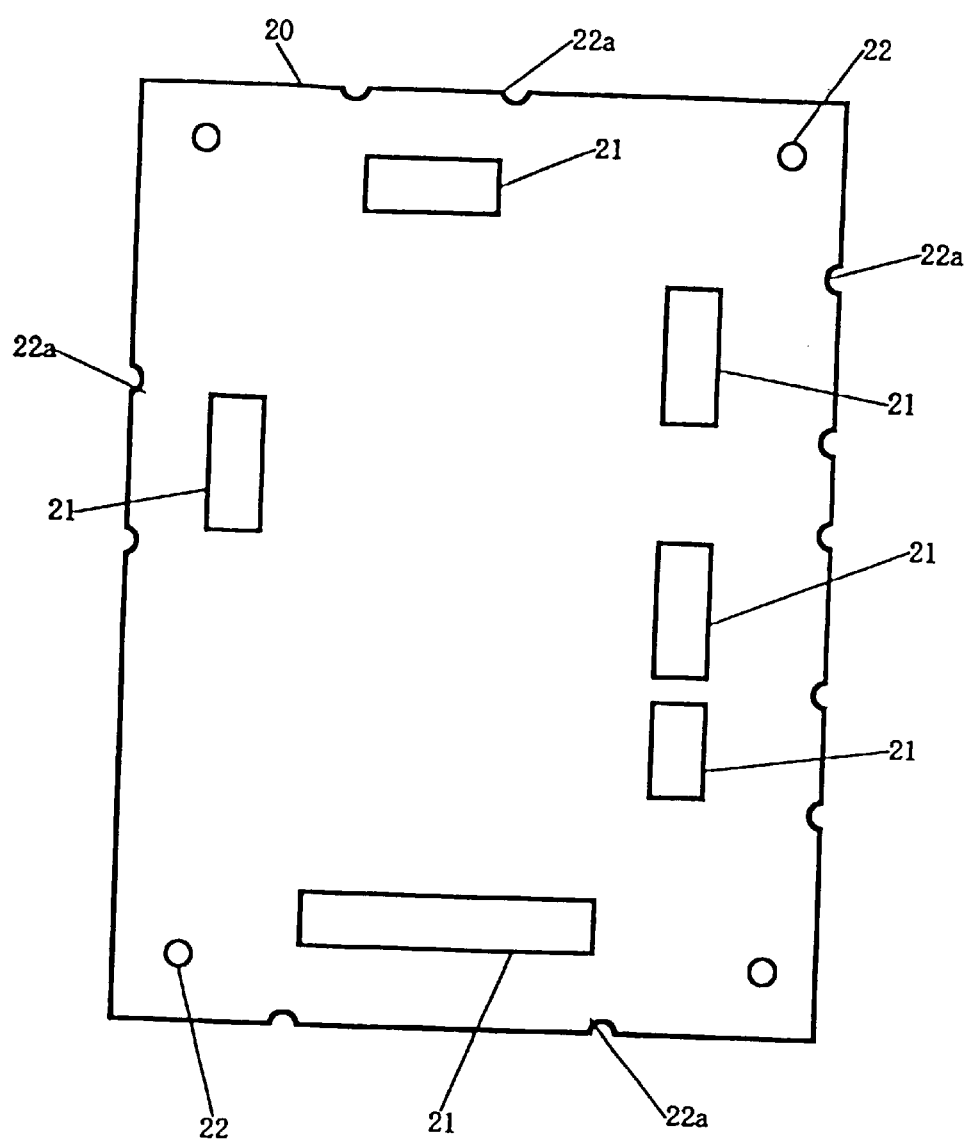
FIG. 4 is a plan view of an insulation film in the wire harness joint constructed according to the first embodiment of the present invention.

A wire harness joint constructed according to the first embodiment of the present invention comprises an insulation film 20 as shown in FIG. 4. Such an insulation film 20 is applied to such a wiring circuit assembly 10 as shown in FIG. 3 on one side. Two such insulation films 20 may be applied to the wiring circuit assembly 10 on the opposite sides. The wiring circuit assembly 10 includes a number of flexible flat cables (FFC's) 11 which are disposed in a rectangular plane with a circuit pattern that the FFC's are separated from one another without intersection. The wiring circuit assembly 10 is punched out from a sheet of copper, copper alloy or aluminum having a thickness ranging between about 0.02–0.3 mm and then processed through etching or plating.

Such a mechanical technique as punching-out is preferably used to provide advantages in that a relatively thick conductive sheet can be worked without use of any chemical substance, thereby widening the selection of materials and adhesives and not adversely affecting the circumstance. Adhesive is applied to the punched FFC's 11 on one or both sides. The insulation film or films 20 are then superposed on the wiring circuit assembly 10. The portions of the conductive sheet having no adhesive are removed after the pressing process. The adhesive FFC's 11 are covered with the insulation film or films 20 to maintain the desired layout.

In the electric circuit shown in FIG. 2, circuits 1—1 and ア—ア are of L-shaped configuration and do not intersect any other circuit. Therefore, FFC's 11 (1—1 and ア—ア) are also formed into L-shaped configuration as in the circuits 1—1 and ア—ア. Circuit 2—2 intersects circuits a-a- . . . -a and b-b- . . . -b. Therefore, FFC 11 (2—2) is formed into a linear configuration while FFC 11 (a-a- . . . -a) is formed into a going-around configuration which surrounds the other circuits. FFC 11 (b-b-, . . . -b) is formed into a serpentined configuration. Thus, FFC's 11 can be disposed in the rectangular plane with such a layout that each FFC 11 will not intersect and contact any other FFC's 11.

The gone-around and serpentined FFC's 11 include connections 12 ア, a, b, 1, 2 . . . ) at their extremities and middles. Each of these connections 12 is located adjacent to the corresponding connection 12 in any other adjacent FFC 11. The wiring circuit assembly 10 includes four positioning pilot holes 13 in the four corners thereof.

On the other hand, each of the insulation films 20 has an area slightly larger than that of the wiring circuit assembly 10 and includes windows 21 formed therethrough at positions corresponding to the connections 12 in the wiring circuit assembly 10, as shown in FIG. 4. The number and shape of the windows 21 depend on those of the connections 12. In order to properly position the insulation film 20 on the wiring circuit assembly 10, the insulation film 20 also includes pilot holes 22 punched therethrough at positions corresponding to the pilot holes 13 of the wiring circuit assembly 10. The insulation film 20 further includes pilot notches 22a peripherally formed therein for accurately positioning and connecting the tips of the wire harnesses 30.

The insulation films 20 are formed by a laminated film comprising a thermoplastic or thermosetting adhesive and a plastic film. The materials of plastic film may preferably include polyethylene terephthalate (PET), polyimide (PI), polyether naphthalate (PEN) and so on.

Figure 5A:
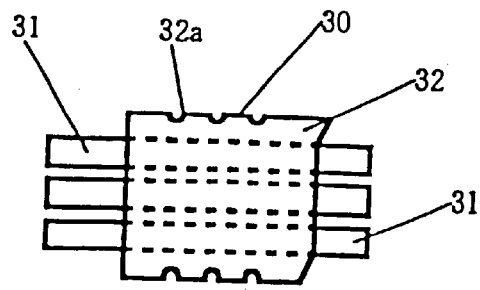
FIGS. 5(a), (b) and (c) show various different wire harnesses to be connected to the wire harness joint constructed according to the first embodiment of the present invention.
Figure 5B:
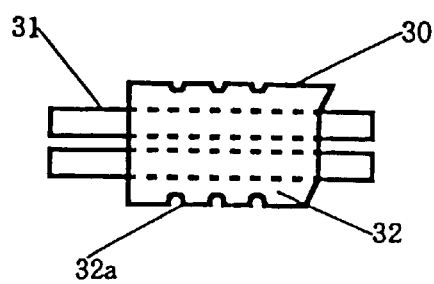
Figure 5C:
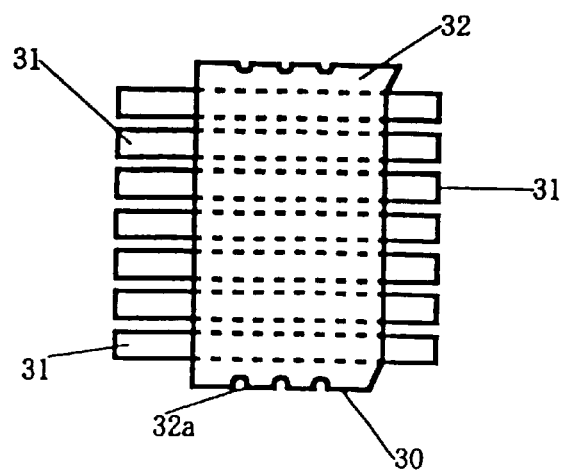

The connections 12 exposed through the windows 21 of the insulation films 20 are bonded to the tips of the wire harness 30 as shown in FIGS. 5(a), (b) and (c). The tips of the wire harness 30 are of the same width as that of the FFC's 11 in the wiring circuit assembly 10 and include a plurality of FFC's 31 held by a holder 32 with the same pitch as that of the connections 12. The sides of the holder 32 include positioning pilot notches 32a formed therein. However, the number of FFC's 31 in the wire harness are different depending on the number of connections 12 as well as the magnitude of the windows 21 in the insulation films 20, as can be seen from FIGS. 5(a), (b) and (c).

The assembling of the wire harness Joint according to the first embodiment of the present invention will be described below.

Figure 6:
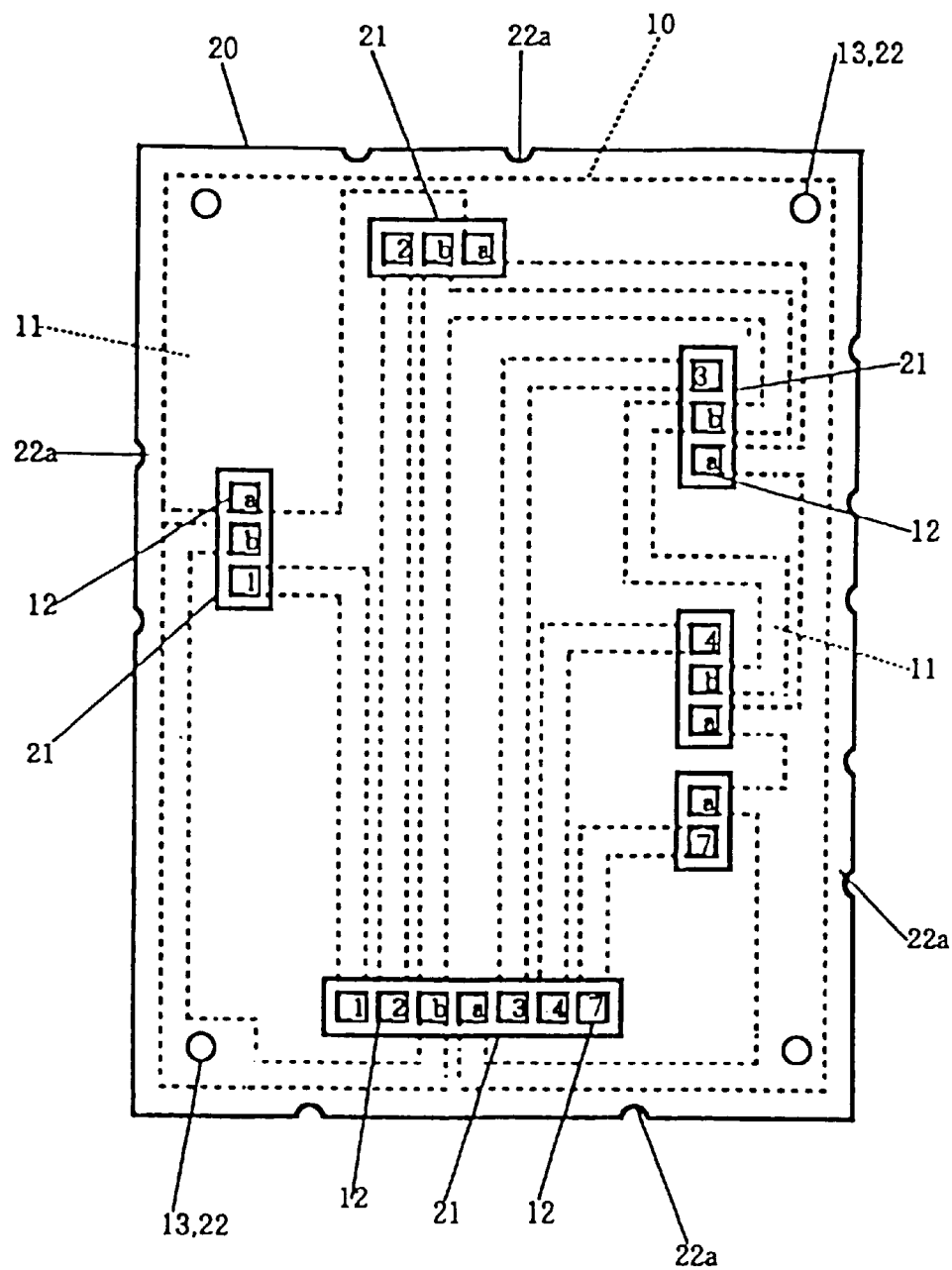
FIG. 6 is a plan view of the wire harness joint constructed according to the first embodiment of the present invention.

First of all, the pilot holes 13 of the wiring circuit assembly 10 are positioned relative to the pilot holes 22 of the insulation film or films 20. The insulation film or films 20 are superposed over the punched conductive sheet to bond the FFC's 11 to the insulation film or films 20. The portions of the conductive sheet not bonded to the insulation film or films 20 are then removed. Thus, FFC's 11 bonded to the insulation film or films 20 are maintained in the desired layout in which the connections 12 of FFC's 11 in the wiring circuit assembly 10 are exposed through the windows 21 of the insulation film or films 20, as shown in FIG. 6. The connections 12 of FFC's 11 of the wiring circuit assembly 10 exposed through the windows 21 are then connected to the tips of FFC's 31 in the wire harness 30 through the pilot notches 22a of the insulation film or films 20 and the pilot notches 32a formed in the holder 32 of the wire harness 30.

At this time, the connections 12 of FFC's 11 in the wiring circuit assembly 10 may precisely be positioned, for example, on the receiving side (or anvil) of a welding jig. Therefore, the connections 12 of FFC's 11 in the wiring circuit assembly 10 can easily be connected to FFC's 31 of the wire harness 30 merely by aligning between the pilot notches 22a of the insulation film or films 20 and the pilot notches 32a of the holder 32 of the wire harness 30. The connections 12 of FFC's 11 in the wiring circuit assembly 10 may be connected to FFC's 31 of the wire harness 30 through any means such as ultrasonic connection, resistance welding (or spot welding), conductive adhesive or the like.

Figure 7:
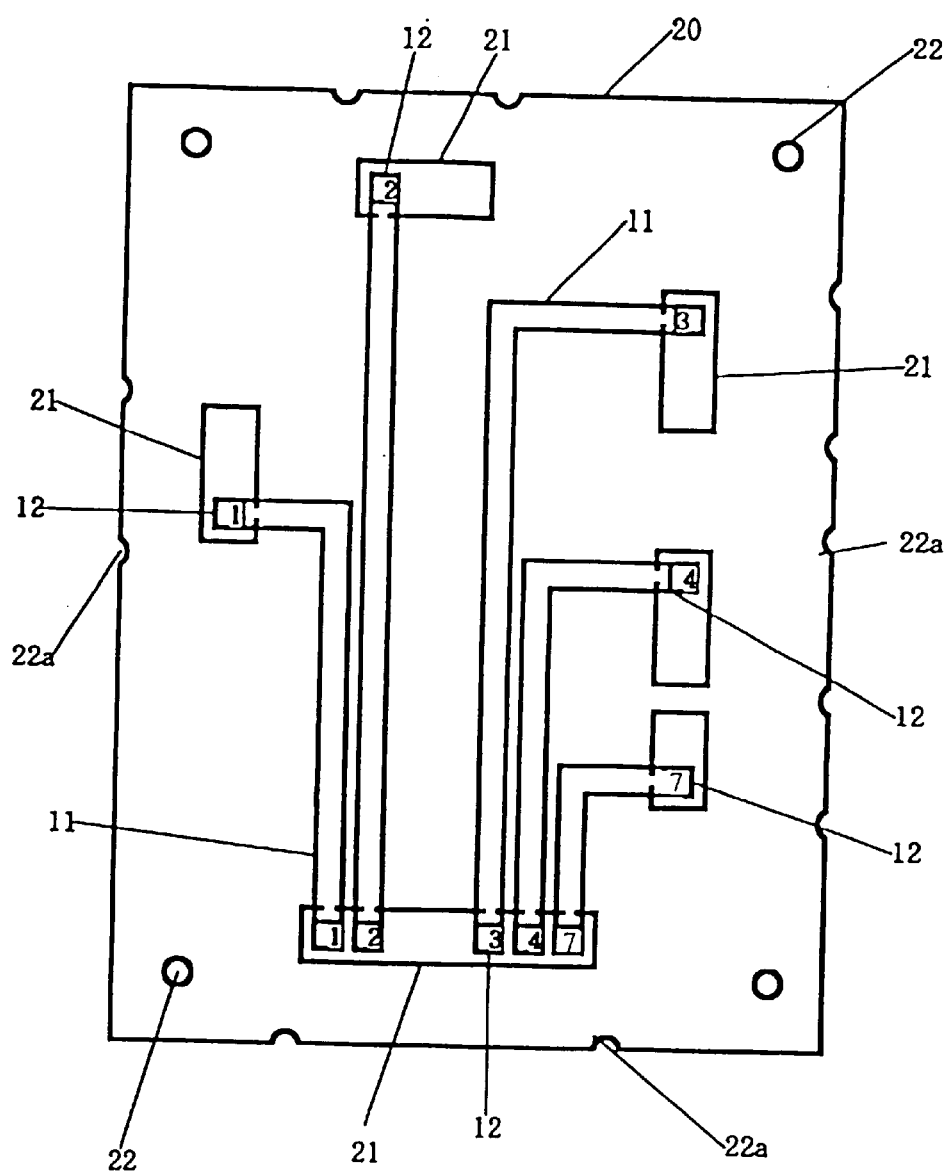
FIG. 7 is a plan view of a wire harness joint constructed according to the second embodiment of the present invention, with the insulation film being applied to the first wiring circuit assembly.

A wire harness joint constructed according to the second embodiment of the present invention will be described with reference to FIGS. 7–11. The wire harness joint comprises a plurality of wiring circuit assemblies 10 in layer and insulation films 20 each interposed between the adjacent wiring circuit assemblies 10. Each of FIGS. 7–10 shows a different insulation film 20 applied on the corresponding wiring circuit assembly 10. As shown in FIG. 7, a wiring circuit assembly 10 layer includes a number of FFC's 11 each of which is of a linear or L-shaped configuration without intersection.

Figure 8:
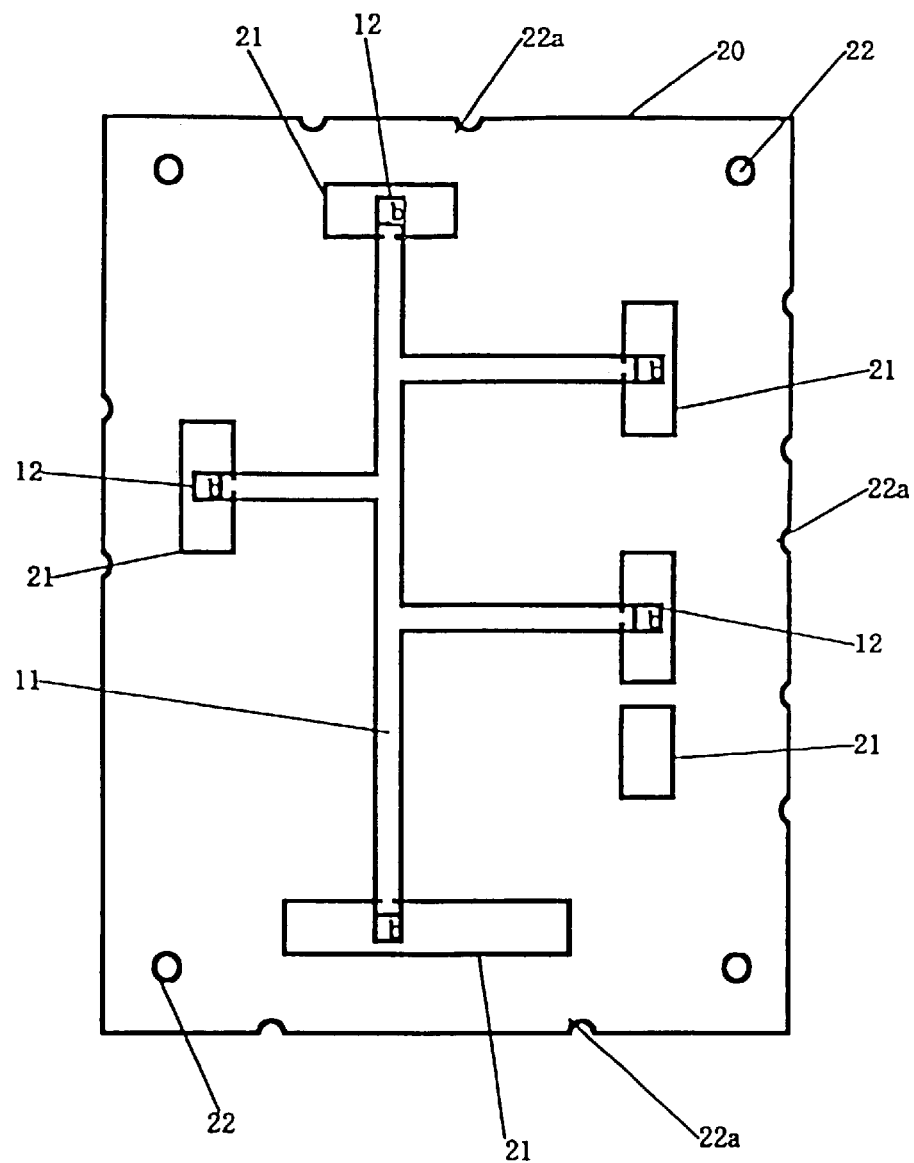
FIG. 8 is a plan view of the wire harness joint constructed according to the second embodiment of the present invention, with the insulation film being applied to the second wiring circuit assembly.
Figure 9:
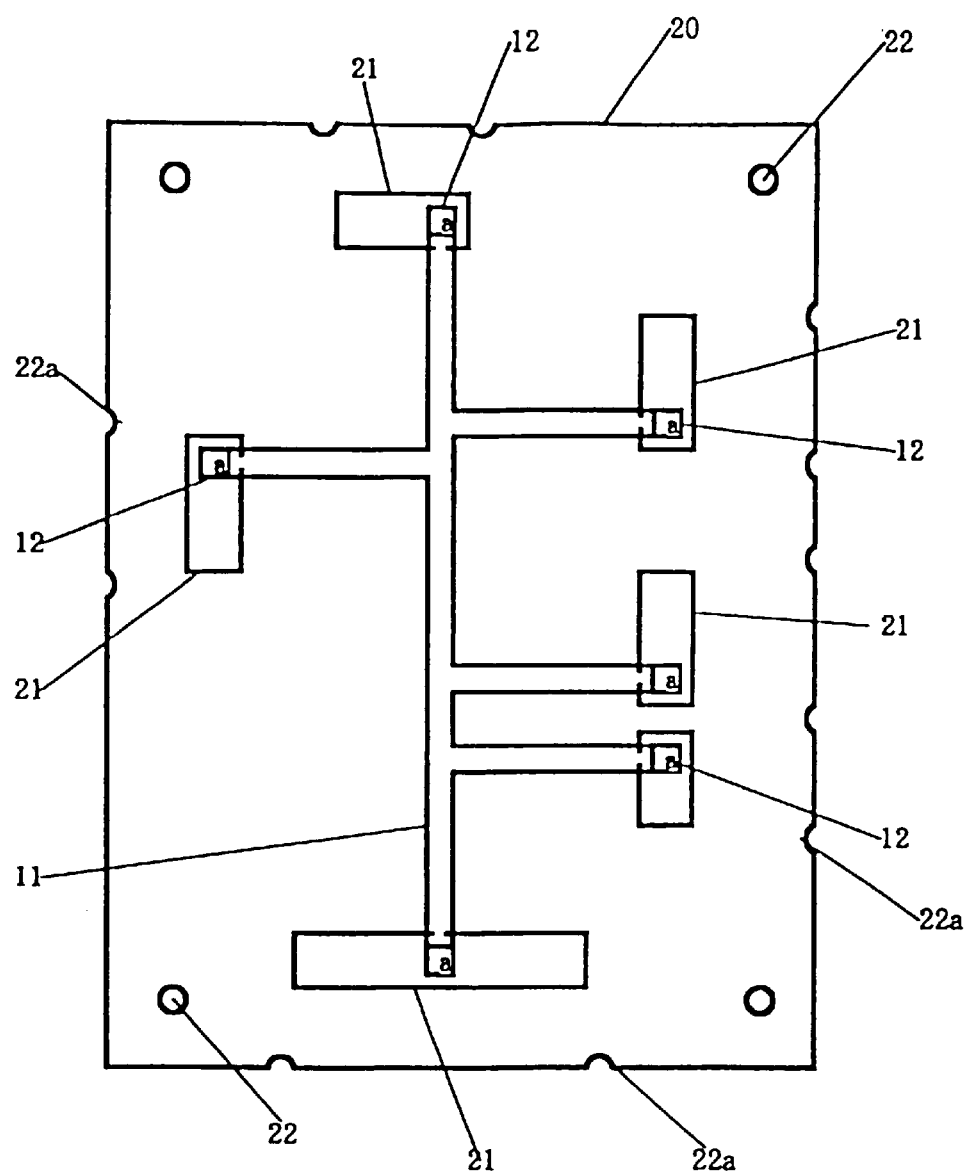
FIG. 9 is a plan view of the wire harness joint constructed according to the second embodiment of the present invention, with the insulation film being applied to the third wiring circuit assembly.

As shown in FIGS. 8 and 9, each of the other wiring circuit assembly 10 layers has an integrated form comprising a single longitudinal FFC 11 and a plurality of transverse FFC's 11 laterally extending from the longitudinal FFC 11. The insulation film 20 of the same configuration is applied on each of such wiring circuit assemblies 10, as shown in FIGS. 7–9. Each of the insulation films 20 has windows 21, pilot holes 22 and pilot notches 22a, all of which are formed at positions common to all the wiring circuit assemblies 10.

Figure 10:
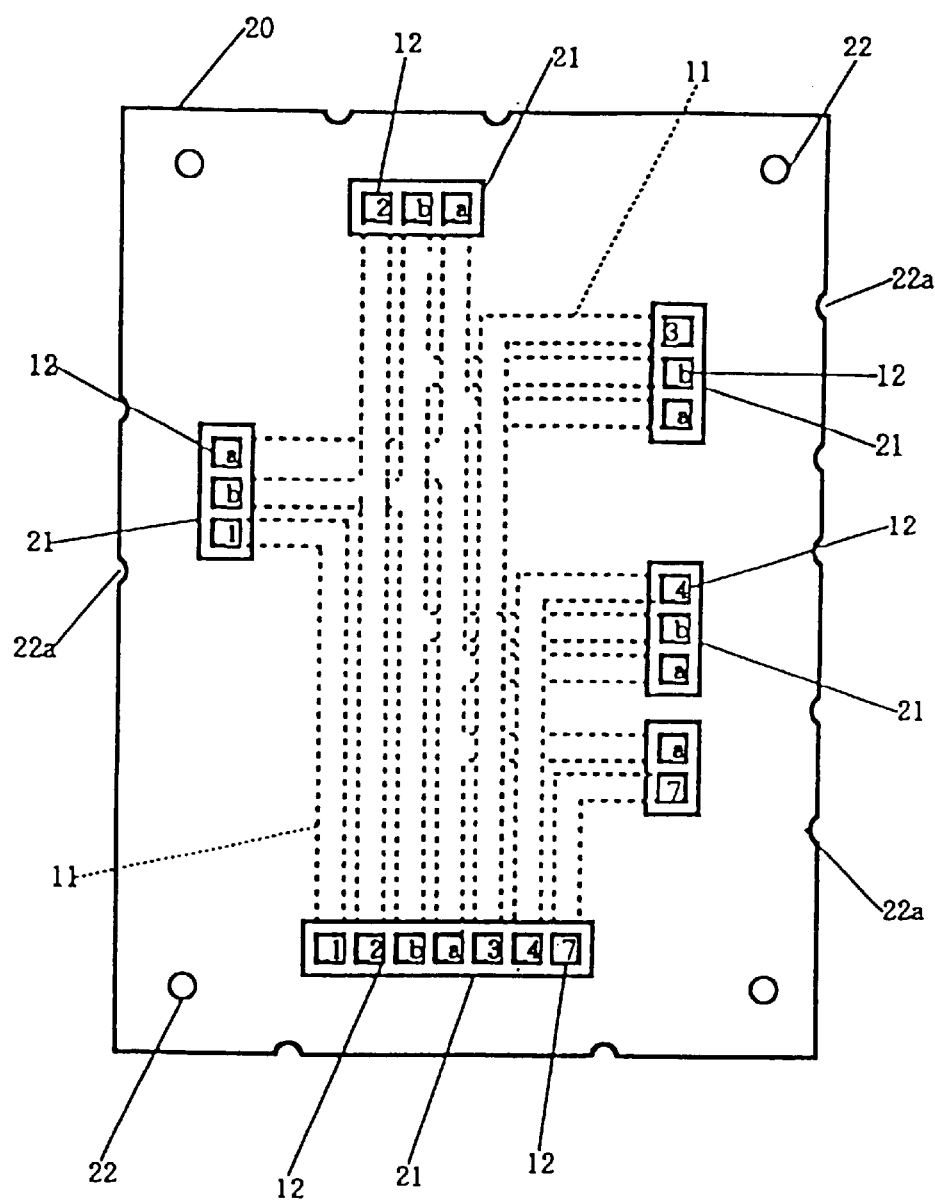
FIG. 10 is a plan view of the wire harness joint constructed according to the second embodiment of the present invention, with the first, second and third wiring circuit assemblies onto which the insulation films are applied being superposed one over another.

When these insulation films 20 are superposed one above another utilizing the pilot holes 13 and 22, such a wire harness joint as shown in FIG. 10 will be formed with the connections 12 exposed through the windows 21 of the insulation films 20. Although FFC's 11 in the wiring circuit assemblies 10 intersect one another as viewed in the plane, they will not contact one another with interposition of the insulation films 20 therebetween. The connections 12 exposed through the windows 21 are connected to the tips of FFC's 31 of the wire harnesses 30 shown in FIG. 5.

Figure 11:
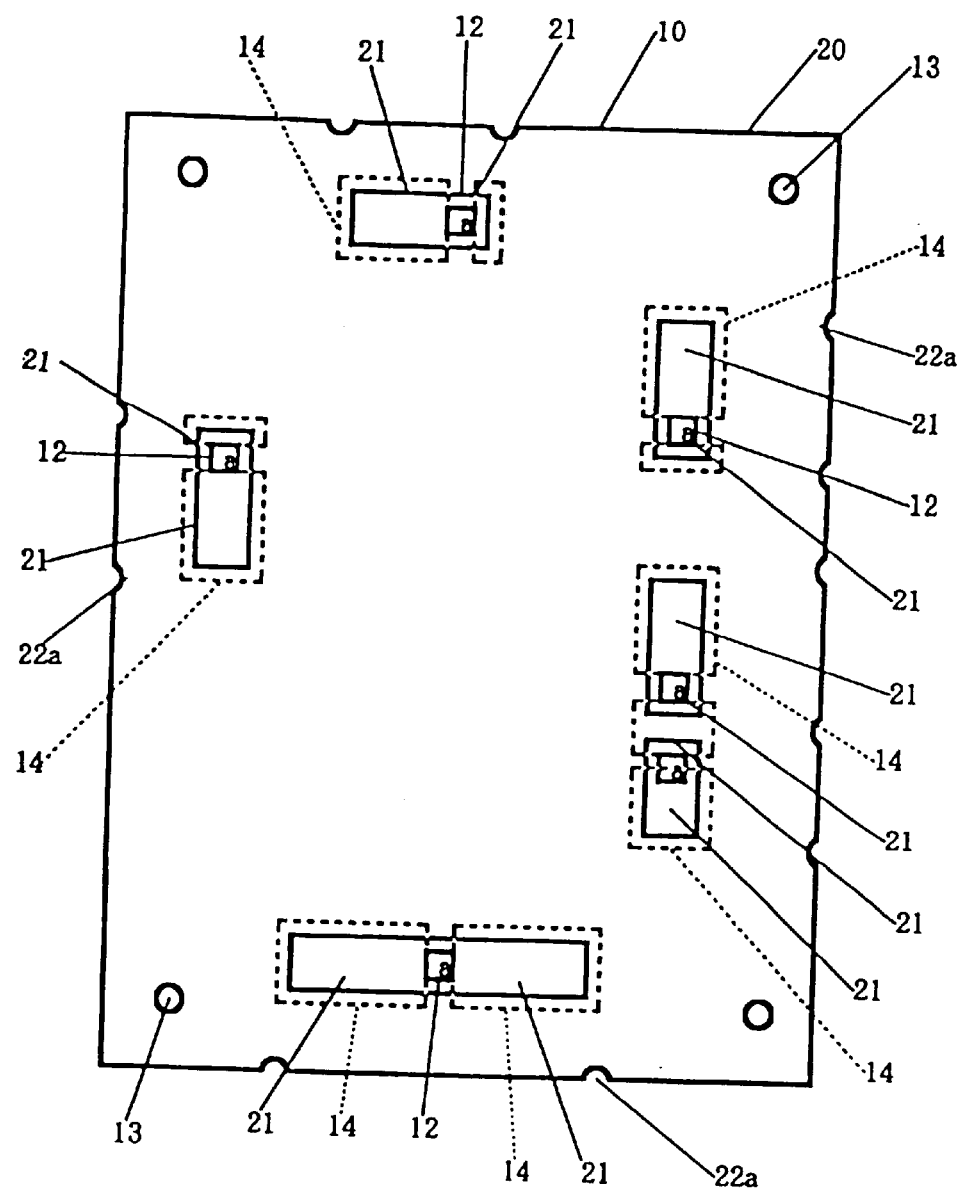
FIG. 11 is a plan view of a modified wire harness joint according to the second embodiment of the present invention.
Figure 12:
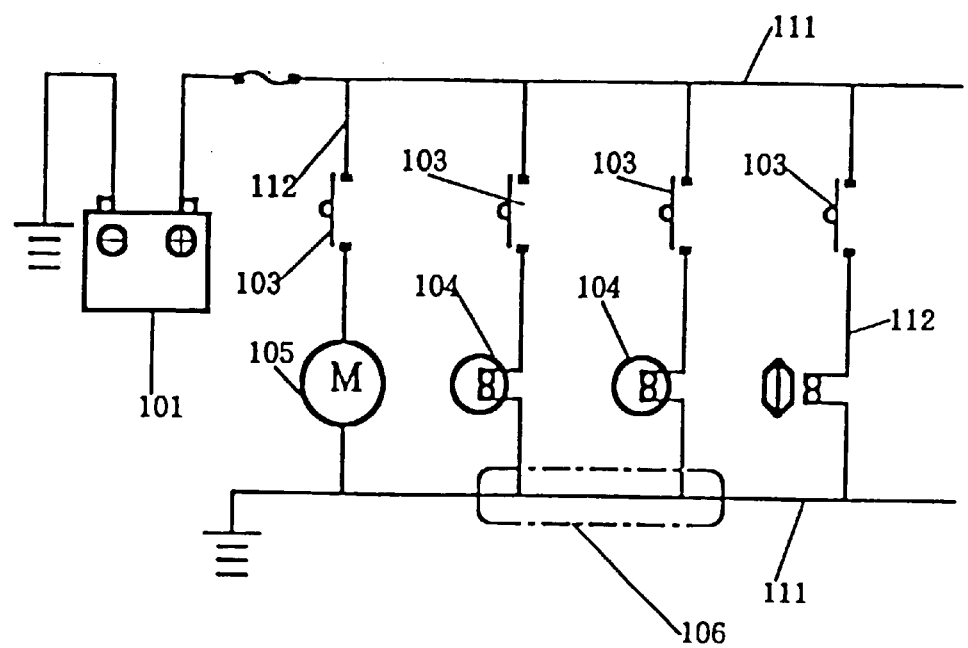
FIG. 12 is a circuit diagram of a vehicle such as motorcar.
Figure 13:
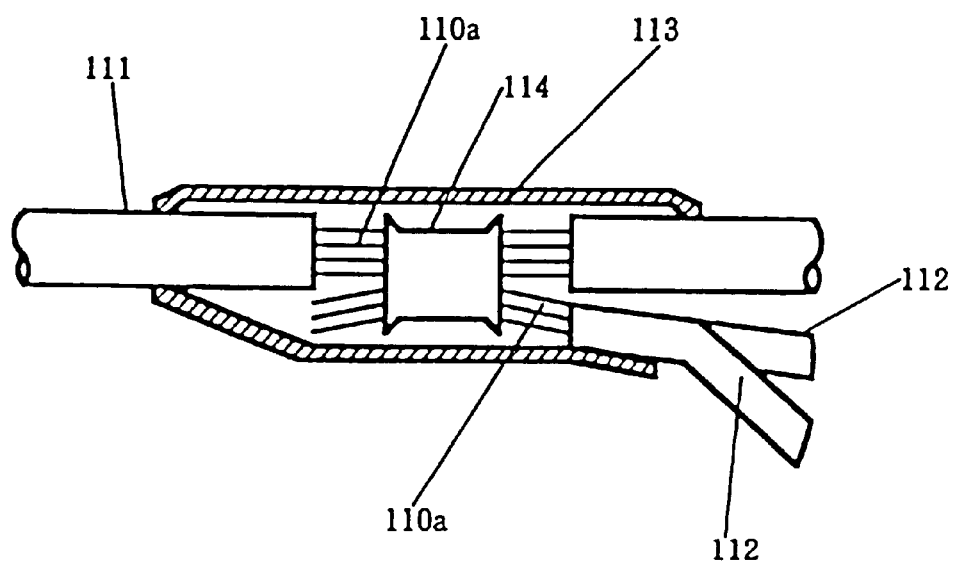
FIG. 13 is a front cross-sectional view of a slice terminal.
Figure 14:
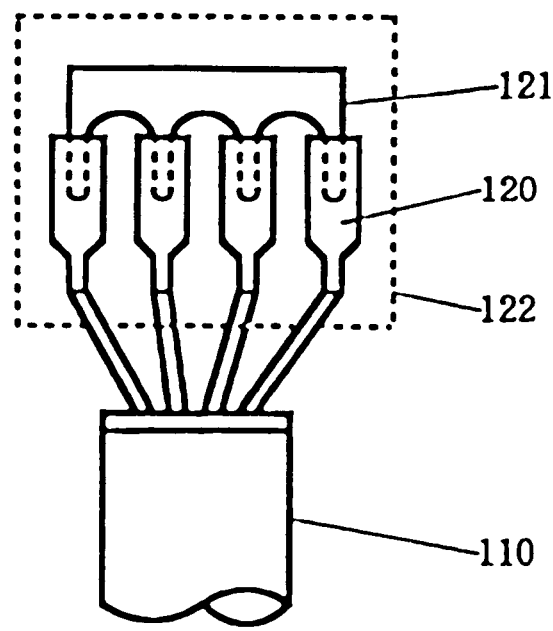
FIG. 14 is a front view of a joint connection.
Figure 15:
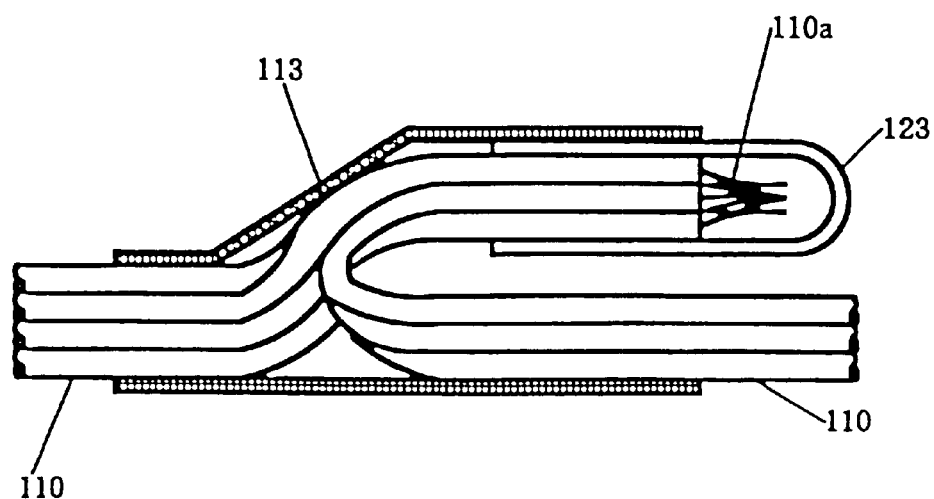
FIG. 15 is a front cross-sectional view of a welded joint.
Figure 16:
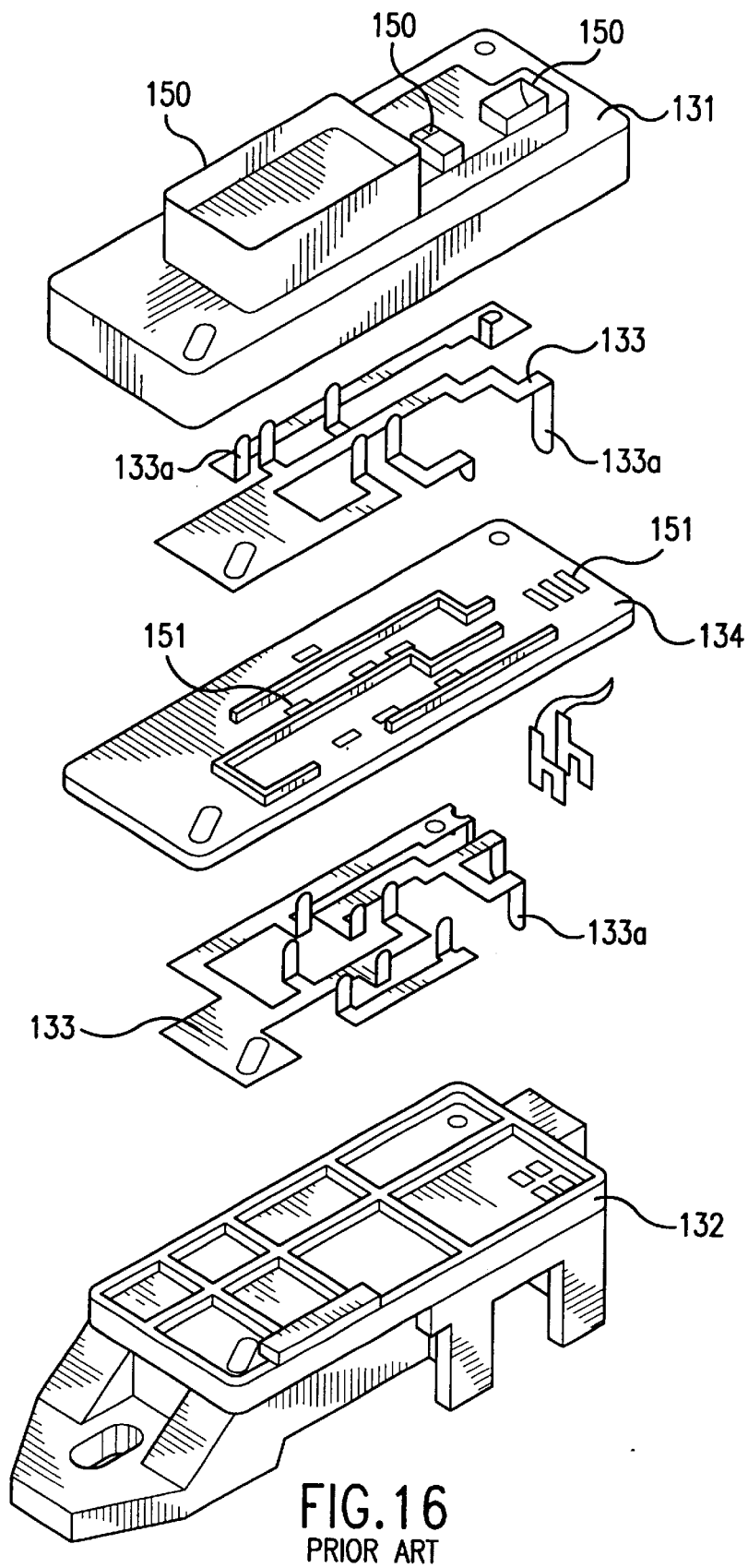
FIG. 16 is an exploded and perspective view of the welded joint.
Figure 17:
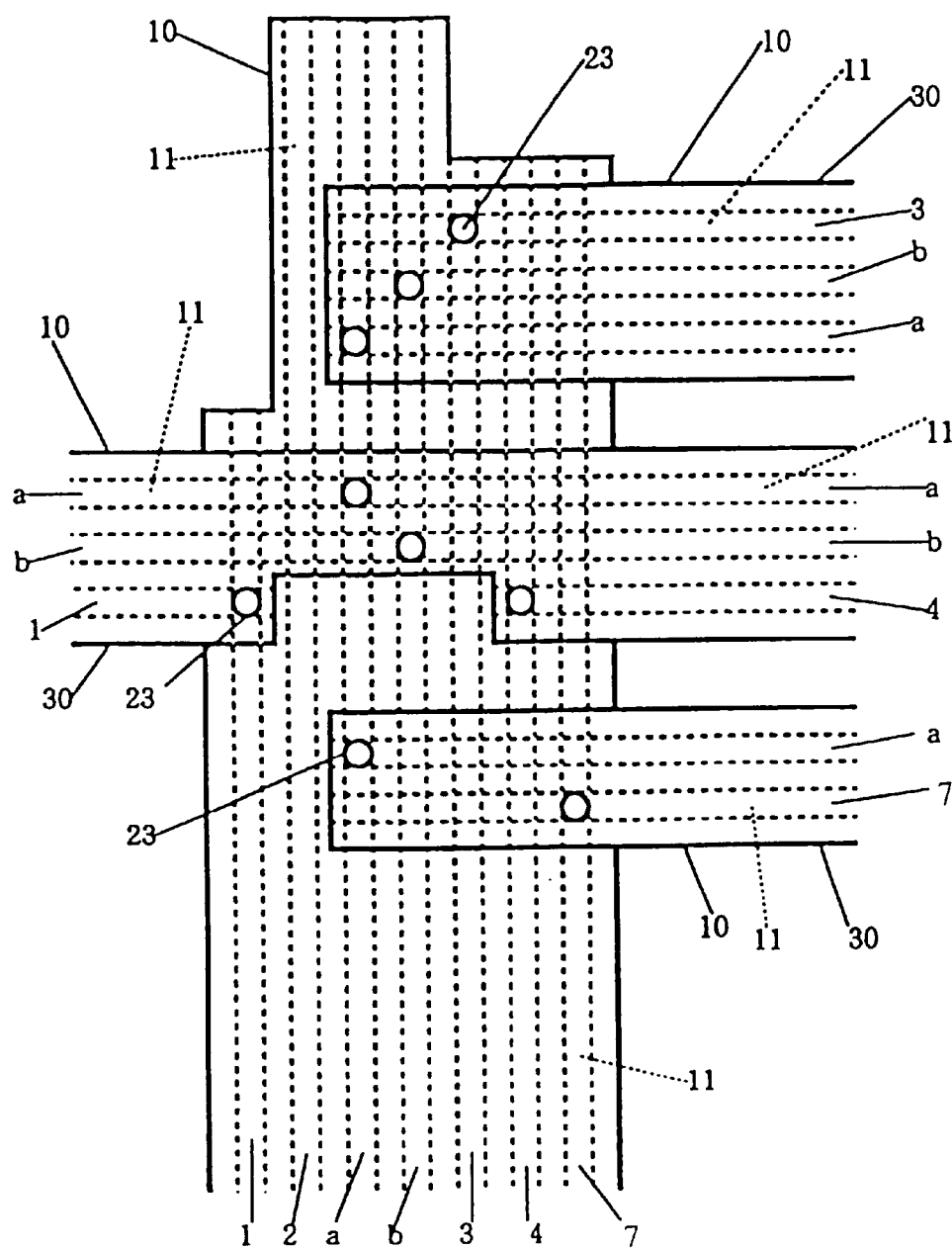
FIG. 17 is a plan view of a joint constructed according to the prior art.

A modification of the second embodiment will be described with reference to FIG. 11. This modification shown in FIG. 11 is a wiring circuit assembly 10 that is suitable for use as a grounding circuit in place of the wiring circuit assembly 10 shown in FIG. 8 or 9. In any event, the wiring circuit assembly 10 is different from those of FIGS. 8 and 9 in that it comprises a large conductive sheet of substantially rectangular configuration and including openings 14 formed therethrough. The openings 14 are formed through the conductive sheet at positions corresponding to the connections 12 to be exposed in the other wiring circuit assemblies 10 shown in FIGS. 8 and 9. Since the wiring circuit assembly 10 of FIG. 11 is used in place of the wiring circuit assembly 10 shown in FIG. 9, each of the openings 14 includes a bridge-like connection 12(a) formed therein at a position corresponding to a connection 12(a) in the wiring circuit assembly 10 shown in FIG. 9. The provision of such bridge-like connections 12(a) is preferable in that the wiring circuit assembly can be strengthened.

An insulation film 20 is applied over the surface of the wiring circuit assembly 10 and includes windows 21 formed therethrough at positions corresponding to the openings 14 of the wiring circuit assembly 10. As can be seen from FIG. 11, each of the windows 21 in the insulation film 20 does not cover the bridge-like connection 12(a) and is smaller than the opening 14 of the wiring circuit assembly 10 to ensure an insulation between the wiring circuit assemblies 10 superposed one above another.

Furthermore, the wiring circuit assembly 10 includes pilot holes 13 formed therethrough while the insulation film 20 includes pilot holes and notches 22, 22a formed therethrough.

When the wiring circuit assembly 10 shown in FIG. 11 is interposed between the wiring circuit assemblies 10 of FIGS. 7 and 8 with the insulation films 20 therebetween by utilizing the pilot holes 13 and 22, there will be completed a wire harness joint having the connections 12 which are exposed through the openings 14 and 21. These connections 12 are then connected to FFC's 31 of the wire harness shown in FIG. 5.

Since the wiring circuit assembly 10 shown in FIG. 11 has an increased area, it can receive an increased amount of electric current and also absorb the heat from the other wiring circuit assemblies 10, resulting in increase of the capacity in the entire wire harness joint. In addition, even though an external matter penetrates the wire harness joint to create a short-circuiting due to any traffic accident, the grounding circuit having its increased area can take the short-circuit such that a protection cut-off mechanism such as fuse or breaker can effectively be activated.

If the wiring circuit assembly 10 of FIG. 11 is the lowermost layer, it is not necessary to apply any insulation film 20 over the side of that wiring circuit assembly 10 on which any other wiring circuit assembly will not be superposed. In order to ensure the insulation relative to any other part, however, it is preferred that insulation films 20 are applied to such a wiring circuit assembly 10 on the opposite sides.

A wire harness joint constructed according to the third embodiment of the present invention will now be described.

Figure 18A:
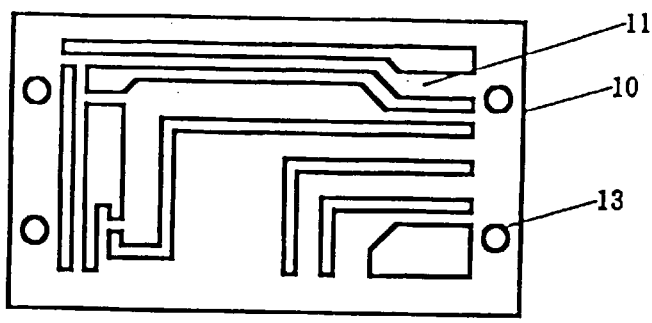
FIG. 18 sequentially illustrates various steps in a process of producing a wire harness joint according to the third embodiment of the present invention.
Figure 18B:
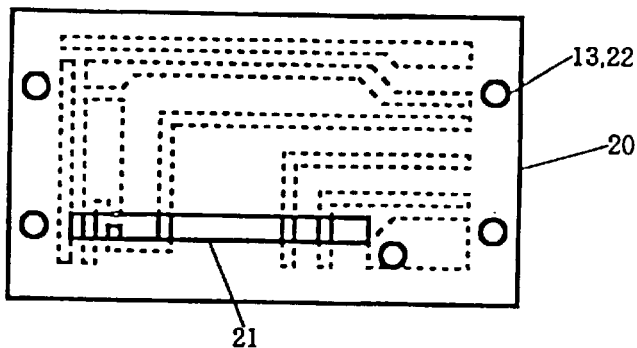
Figure 20:
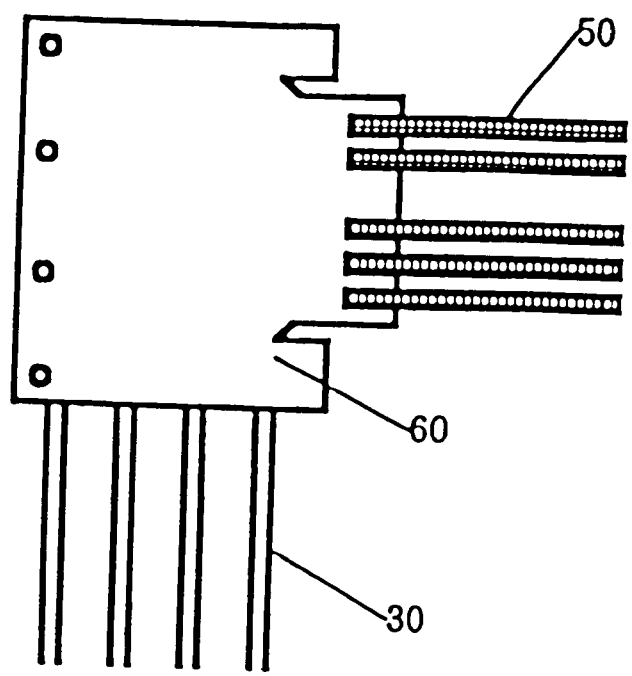
FIG. 20 is a plan view of the wire harness joint constructed according to the third embodiment of the present invention.
Figure 21A:
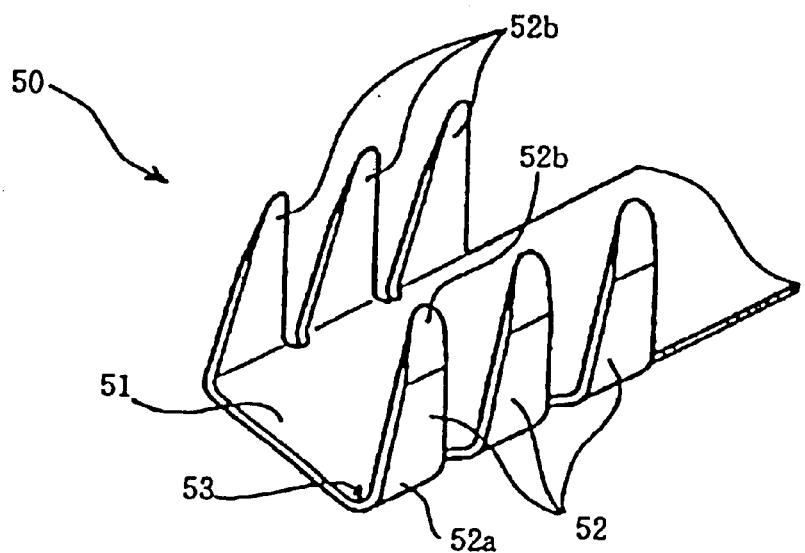
Figure 21B:
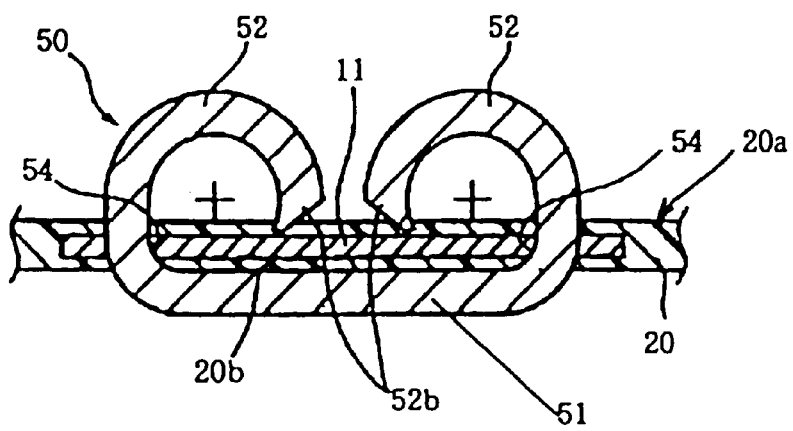
FIG. 21(B) is a cross-sectional view showing the connection terminal connected to FFC of the wiring circuit assembly.

FIGS. 18 and 19 illustrate the process of producing the wire harness joint according to the third embodiment in the order of successive steps. FIG. 20 is a plan view of the wire harness joint according to the third embodiment. FIG. 21(A) is a perspective view of the structure of a connection terminal while FIG. 21(B) is a cross-sectional view of the connection terminal connected to FFC's in a wiring circuit assembly.

As shown in FIG. 18(A), a wiring circuit assembly 10 is formed by punching a thin conductive sheet of copper, copper alloy, aluminum or the like and of a thickness ranging between about 0.02 mm and about 0.3 mm into a given configuration. The wiring circuit assembly 10 includes positioning pilot holes 13 formed therethrough.

The wiring circuit assembly 10 is pressed for deforming and modifying.

Insulation films 20 including windows 21 and pilot holes 22 are superposed over the wiring circuit assembly 10 on the front and back sides while positioning the pilot holes of the wiring circuit assembly 10 relative to the pilot holes 22 of the insulation films 20. After temporary clamping, the insulation films 20 are thermally pressed and firmly attached to the wiring circuit assembly 10.

If necessary, bridge portions connecting between FFC's 11, which form a circuit pattern in the wiring circuit assembly 10, are then cut off.

Figure 18C:
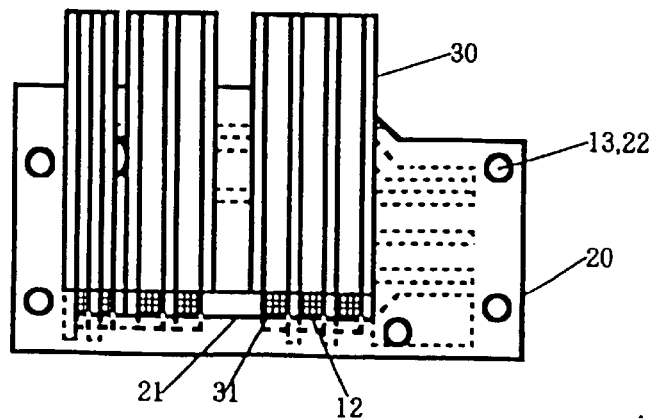

As shown in FIG. 18(C), the connections 12 of the wiring circuit assembly 10 exposed through the windows 21 are then connected to the tips of FFC's 31 of the wire harness 30 through spot welding or the like.

Figure 19A:
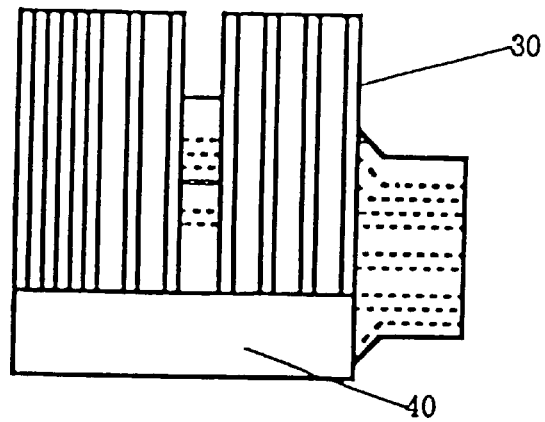
FIG. 19 sequentially illustrates various steps in a process of producing a wire harness joint according to the third embodiment of the present invention.

As shown in FIG. 19(A), patches 40 for covering the welded portions are temporarily attached to the tips of the wire harness 30. Thereafter, the patches 40 are thermally pressed and firmly fixed to the wiring circuit assembly before unnecessary outline portions are cut off.

Figure 19B:
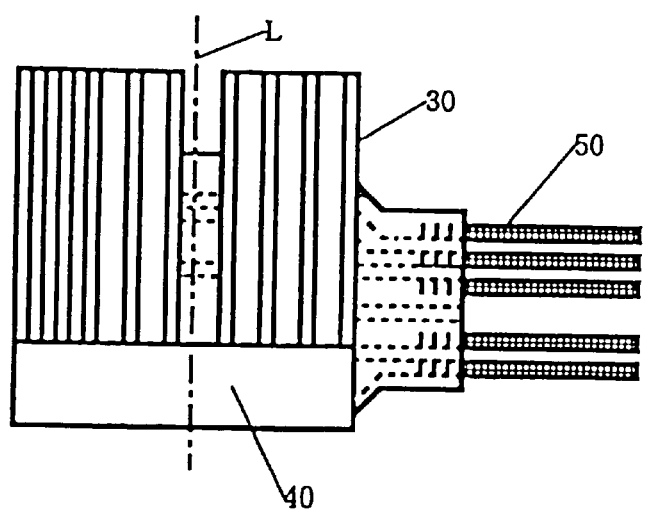

Subsequently, as shown in FIG. 19(B), connection terminals 50 are clamped in pressure onto FFC's 11 of the wiring circuit assembly 10. As can be seen from FIG. 21(A), the clamped portion of each of the connection terminals 50 are formed by a conductive metal sheet and includes a rectangular flat surface 51 and a plurality (six in FIG. 21) of upstanding legs 52 extending from the longitudinal sides of the flat surface 51 substantially at right angle. Each of the upstanding legs 52 is tapered from its proximal end 52a to its distal end 52b. Each of the distal ends 52b is chamfered through cutting or crushing. The angle of chamfer is preferably between 15 degrees and 45 degrees since the distal ends 52b can easily be penetrated into the flat cable. The radius of curvature in a turned portion 53 between each upstanding leg 52 and the flat surface 51 is preferably between 0.25 times the thickness of the sheet used and a value equal thereto.

As shown in FIG. 21(B), the tips 52b of the upstanding portions 52 in the connection terminal 50 are turned toward one another to penetrate into the insulation film and FFC 11. Thus, the tips 52b again contact the surface 20a of the insulation film 20 to urge the back side 20b of the insulation film 20 against the flat surface 51 of the connection terminal 50. At this time, the inner walls 54 of the upstanding legs 52 will electrically be connected to FFC 11. As shown in FIG. 21(B), the radius of each of the turned upstanding legs 52 is preferably between 0.25 and 1.5 times the thickness of the connection terminal.

Figure 19C:
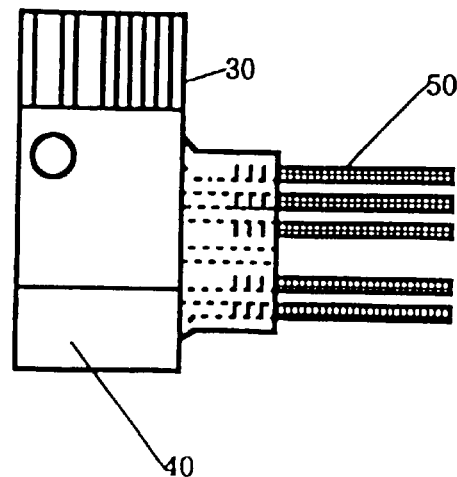

Subsequently, as shown in FIG. 19(C), the wiring circuit assembly 10 covered with the insulation films 20, batches 40 and wire harness 30 are turned over the connection terminal 50 about a line L (see FIG. 19(B)) such that the wire harness 30 is superposed on the connection terminal 50.

Finally, corner protectors 60 are attached to the wire harness 30 and the wiring circuit assembly 10 covered with the insulation film 20 to complete a wire harness joint according to the third embodiment.

According to the third embodiment, the wire harness 30 and others are turned over to reduce its occupying area. This can reduce the dimensions of the entire device.

Since FFC's 11 of the wiring circuit assembly 10 are connected to the connection terminals 50 shown in FIG. 21, the electrical connection can be improved.

Figure 22A:
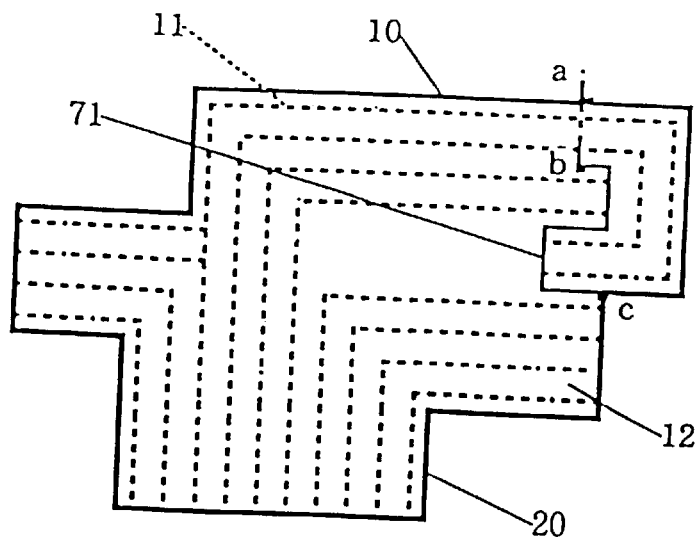
FIGS. 22(A) and (B) are plan views showing a wire harness joint constructed according to the fourth embodiment of the present invention.
Figure 22B:
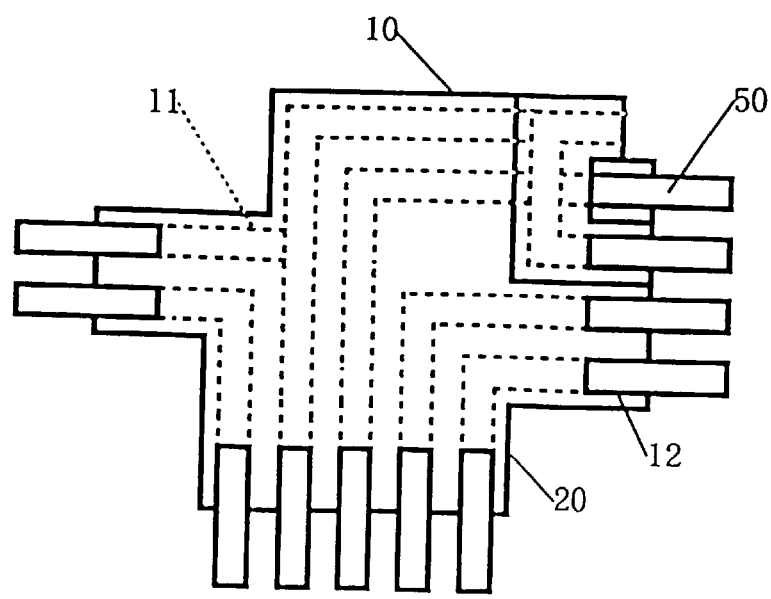

FIGS. 22(A) and (B) are plan views illustrating a wire harness joint constructed according to the fourth embodiments of the present invention.

In the fourth embodiment, as shown in FIG. 22(A), a slit 71 (as shown by a line b-c) is formed in a wiring circuit assembly 10. The wiring circuit assembly is turned about a line a-b to provide the aligned extremities of the connections 12.

According to the fourth embodiment, connection terminals 50 can more easily be clamped since the wiring circuit assembly 10 is turned to provide the aligned extremities of the connections 12.

The present invention is not limited to the aforementioned forms, but may be modified and changed into various other forms without departing from the scope of the invention as claimed in the accompanying claims. For example, although either of the wire harness joints has been described as to flat-sheet configuration, the wire harness joint can freely be shaped depending on the shape of vehicle and instrument mountings since FFC's 11 and insulation films 20 are flexible. This can reduce the area occupied by the wire harness joint and enables the wire harness joints to be disposed in a dispersed manner.

Furthermore, by covering the connections between the connections 12 of FFC's 11 and FFC's 31 of the wire harness 30 with insulation films 20 or by insert molding any insulation material such as resin into any suitable configuration, the wire harness joint can be mechanically and electrically protected. At the same time, the whole or part of the insulation film or the whole or part of the resin can be fixed to the structural material of the vehicle or instrument. In addition, the wire harness joint can be of an integrated structure composed of the FFC's of the wire harness 30 and wiring circuit assembly 10 without connection between the tips of the wire harness 30 and the connections 12 of the wiring circuit assembly 10.

According to the present invention, the wire harness joint can be reduced in thickness and connected to many electric parts without any joint box which would be used in the prior art, since the wire harness joint is formed by the wiring circuit assemblies and insulation films which are superposed one another. Therefore, the present invention can satisfy the need of improving the conformability in the motorcar. In addition, the wire harness joint reduced in thickness can reduce the weight of the motorcar, resulting in improvement of the fuel consumption.

Since the wire harness joint of the present invention is formed merely by superposing the wiring circuit assemblies and insulation films one another, it may extremely easily be produced. Furthermore, since the wire harness joint of the present invention can automatically be connected to the wire harness, the manufacturing cost can also be reduced.

What is claimed is:

1. A wire harness joint comprising:
   a wiring circuit assembly having opposite sides and a plurality of first flexible flat cables; and
   an insulation film applied to at least one of the opposite sides of the wiring circuit assembly, each of the first flexible flat cables in the wiring circuit assembly having a connection for connecting to a wire harness in which a plurality of second flexible flat cables are arranged in parallel, the insulation film including windows, wherein each window is formed through the insulation film at a position corresponding to a respective one of the connections, wherein the wiring circuit assembly and the insulation film each include positioning pilot holes formed therethrough, and the insulation film and the wire harness each include positioning pilot notches formed therein.

2. A wire harness joint as defined in claim 1, wherein the wiring circuit assembly comprises a plurality of layers and wherein one insulation film is interposed between adjacent layers in the wiring circuit assembly.

3. A wire harness joint as defined in claim 1, further comprising:
   a connection terminal having a flat face portion and a plurality of raised portions formed on opposite side edges of the flat face portion, each raised portion being turned back towards another raised portion and having a tip end extending through the insulation film so that an inner wall electrically is connected to a first flexible flat cable of the plurality of first flexible flat cables of the wiring circuit assembly, thereby mounting and electrically connecting the connection terminal to the wiring circuit assembly.

4. A wire harness joint as defined in claim 1, wherein the wiring circuit assembly, insulation film and connection portions of the wire harness joint are covered with an adhesive insulation film, wherein the whole or part of the adhesive insulation film is fixedly mounted on a structural material in a vehicle or instrument.

5. A wire harness joint as defined in claim 1, wherein the wiring circuit assembly, insulation film and connection portions of the wire harness joint are shaped to provide a shaped portion configured to a mount portion of a vehicle or instrument, wherein the whole or part of the shaped portion is fixedly mounted on structural material of the vehicle or instrument.

6. A wire harness joint as defined in claim 1, wherein the wiring circuit assembly and the wire harness connected to the wiring circuit assembly are folded over about a predetermined line.

7. A wire harness joint as defined in claim 1, wherein the wiring circuit assembly includes slits formed therein by partially cutting and the wiring circuit assembly includes a turned about portion that is turned about a predetermined line defined by the slits, which arranges ends of plural connections in parallel.

8. A wire harness joint comprising:
   a first wiring circuit assembly comprising a plurality of first flexible flat cables and opposite sides;
   an insulation film applied to at least one of the opposite sides of the first wiring circuit assembly; and
   a second wiring circuit assembly having second bridge-like connections formed therein with each bridge-like second connection being formed between two openings, wherein each of the first flat flexible cables in the first wiring circuit assembly have a first connection for connecting to a wire harness in which a plurality of second flexible flat cables are arranged in parallel, and the insulation film includes windows formed therethrough, each window formed at a position corresponding to a respective position of one of the first connections, and each of the second connections is connected to a corresponding one of the first connections, wherein the first wiring circuit assembly, second wiring circuit assembly and insulation film each include positioning pilot holes formed therethrough, and the insulation film and the wire harness each include positioning pilot notches formed therein.

* * * * *